US011852689B2

(12) United States Patent
Wiegman

(10) Patent No.: US 11,852,689 B2
(45) Date of Patent: Dec. 26, 2023

(54) CONNECTOR FOR CHARGING AN ELECTRIC AIRCRAFT AND A METHOD OF USE FOR A CONNECTOR FOR CHARGING AN ELECTRIC AIRCRAFT

(71) Applicant: BETA AIR, LLC, South Burlington, VT (US)

(72) Inventor: Herman Wiegman, South Burlington, VT (US)

(73) Assignee: BETA AIR, LLC, South Burlington, VT (US)

( * ) Notice: Subject to any disclaimer, the term of this patent is extended or adjusted under 35 U.S.C. 154(b) by 0 days.

(21) Appl. No.: 17/563,174

(22) Filed: Dec. 28, 2021

(65) Prior Publication Data

US 2023/0204680 A1 Jun. 29, 2023

(51) Int. Cl.

| | |
|---|---|
| *G01R 31/36* | (2020.01) |
| *G01R 31/392* | (2019.01) |
| *G01R 31/396* | (2019.01) |
| *G01R 31/3842* | (2019.01) |
| *G01R 31/371* | (2019.01) |
| *B64C 39/02* | (2023.01) |

(Continued)

(52) U.S. Cl.
CPC .......... *G01R 31/392* (2019.01); *B64C 39/024* (2013.01); *G01R 31/364* (2019.01); *G01R 31/371* (2019.01); *G01R 31/3842* (2019.01); *G01R 31/396* (2019.01); *B64U 50/19* (2023.01)

(58) Field of Classification Search
CPC .. G01R 31/392; G01R 31/364; G01R 31/396; G01R 31/371; B64C 39/024; B64C 2201/042

USPC .................................. 244/17, 230; 320/109
See application file for complete search history.

(56) References Cited

U.S. PATENT DOCUMENTS

| | | | |
|---|---|---|---|
| 9,007,022 | B2 | 4/2015 | Ohkuma et al. |
| 9,126,486 | B2 | 9/2015 | Kinomura et al. |
| 9,610,849 | B2 | 4/2017 | Sawada et al. |

(Continued)

FOREIGN PATENT DOCUMENTS

| | | | | |
|---|---|---|---|---|
| CN | 102414044 A | * | 4/2012 | ............. B60K 37/06 |
| CN | 105471022 A | * | 4/2016 | ............. H02J 7/0068 |

(Continued)

OTHER PUBLICATIONS

Naveenkumar Marati, S R Rahul, Architecture of Security Faults and Its Diagnosis in Connecting Electric Vehicle to the Charging Station, Oct. 27, 2018.

(Continued)

*Primary Examiner* — Nathaniel R Pelton
(74) *Attorney, Agent, or Firm* — Caldwell Intellectual Property Law, LLC

(57) ABSTRACT

Aspects relate to a connector for charging an electric vehicle and a method for its use. An exemplary connector includes at least a direct current conductor configured to conduct a direct current, at least an alternating current conductor, configured to conduct an alternating current, at least a computing device wherein the computer is configured to receive a measurement datum of a battery module from a communicatively connected sensor, determine an operating condition of the charging circuit; identify an error element as a function of the operating condition, and transmit the identification of the error element to a data storage system.

16 Claims, 7 Drawing Sheets

(51) Int. Cl.
*G01R 31/364* (2019.01)
*B64U 50/19* (2023.01)

(56) References Cited

U.S. PATENT DOCUMENTS

| | | | |
|---|---|---|---|
| 9,914,364 B2 | 3/2018 | Shumaker et al. | |
| 10,322,636 B2 | 6/2019 | Lee et al. | |
| 10,978,899 B2* | 4/2021 | Qiu | H02J 50/12 |
| 11,569,668 B2* | 1/2023 | Tyagi | H02M 1/007 |
| 2009/0326749 A1 | 12/2009 | Uchida | |
| 2012/0091958 A1* | 4/2012 | Ichikawa | B60K 37/06 |
| | | | 320/109 |
| 2013/0113413 A1* | 5/2013 | Harty | B60L 53/305 |
| | | | 320/109 |
| 2017/0106764 A1* | 4/2017 | Beaston | B60L 53/31 |
| 2017/0149264 A1* | 5/2017 | Deng | H02J 7/00712 |
| 2017/0225578 A1* | 8/2017 | Paryani | B60L 53/36 |
| 2018/0126861 A1 | 5/2018 | Dörndorfer et al. | |
| 2018/0284047 A1* | 10/2018 | Kim | H04M 1/72454 |
| 2019/0131668 A1* | 5/2019 | Bitauld | B60L 3/0046 |
| 2019/0326762 A1 | 10/2019 | Zoon et al. | |
| 2020/0062138 A1* | 2/2020 | Smolenaers | B60L 53/24 |
| 2020/0189416 A1 | 6/2020 | Jung et al. | |
| 2020/0331355 A1 | 10/2020 | Choi et al. | |
| 2020/0412147 A1 | 12/2020 | Mandel et al. | |
| 2021/0237605 A1 | 8/2021 | Ando | |

FOREIGN PATENT DOCUMENTS

| | | | |
|---|---|---|---|
| DE | 102016106840 A1 | 10/2017 | |
| DE | 102017209450 A1 | 12/2018 | |
| DE | 102019215408 A1 | 4/2021 | |
| JP | 2016063736 A * | 4/2016 | B60L 11/1848 |
| JP | 2018133238 A | 8/2018 | |

OTHER PUBLICATIONS

Paribesh Ranabhat, Secure Design and Development of IoT Enabled Charging Infrastructure for Electric Vehicle; Using CCS Standard for DC Fast Charging, Apr. 28, 2018.

Phoenix Contact, Charging technology for electromobility, Jan. 1, 2019.

Paul Reid, Chad Mittelstadt, Electric Vehicle Conductive Charge Couplers , Oct. 12, 2014.

* cited by examiner

CONNECTOR FOR CHARGING AN ELECTRIC AIRCRAFT AND A METHOD OF USE FOR A CONNECTOR FOR CHARGING AN ELECTRIC AIRCRAFT

FIELD OF THE INVENTION

The present invention generally relates to the field of electric vehicle chargers. In particular, the present invention is directed to a connector for charging an electric vehicle and a method of use for a connector for charging an electric vehicle.

BACKGROUND

Electric vehicles typically derive their operational power from onboard rechargeable batteries. However, it can be a complex task to implement charging of these batteries in a safe manner.

SUMMARY OF THE DISCLOSURE

In an aspect, a connector for charging an electric vehicle is provided. A connector includes at least a conductor configured to conduct a current within a charging circuit which includes at least a battery module. A conductor includes at least a direct current conductor configured to conduct a direct current and at least an alternating current conductor configured to conduct an alternating current. The connector also includes a computing device, wherein the computing device is configured to: receive a measurement datum of a battery module from a communicatively connected sensor, determine an operating condition of the charging circuit, identify an error element as a function of the operating condition; and transmit the identification of the error element to a data storage system.

In another aspect, a method of use for a connector for charging an electric vehicle, wherein the method includes conducting using at least a conductor configured to conduct a current within a charging circuit including at least a battery module. A conductor includes at least a direct current conductor configured to conduct a direct current and at least an alternating current conductor configured to conduct an alternating current. The method of use for the connector also includes receiving measurement datum of the at least a battery module from a communicatively connected sensor, determine using a controller an operating condition of the charging circuit, identifying an error element as a function of charger input, and transmitting an error element into a data storage system.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to a connector for charging an electric vehicle and a method of use for a connector for charging an electric vehicle. In an embodiment, this can be accomplished by a computing device configured to receive measurement datum of a battery module, determine operating conditions of the charging circuit, identify an error as a function of the operating condition, transmit the identification of the error element to a data storage system. Aspects of the present disclosure can desirably be used to detect problems. Aspects of the present disclosure can desirably be used to protect a battery during charging. Aspects of the present disclosure can also be desirably used to protect an electric aircraft which is being charged. This is so, at least in part, because connector includes a computing device that can be configured to identify, collect, and store datum regarding the charging circuit. Exemplary embodiments illustrating aspects of the present disclosure are described below in the context of several specific examples.

Figure 1:
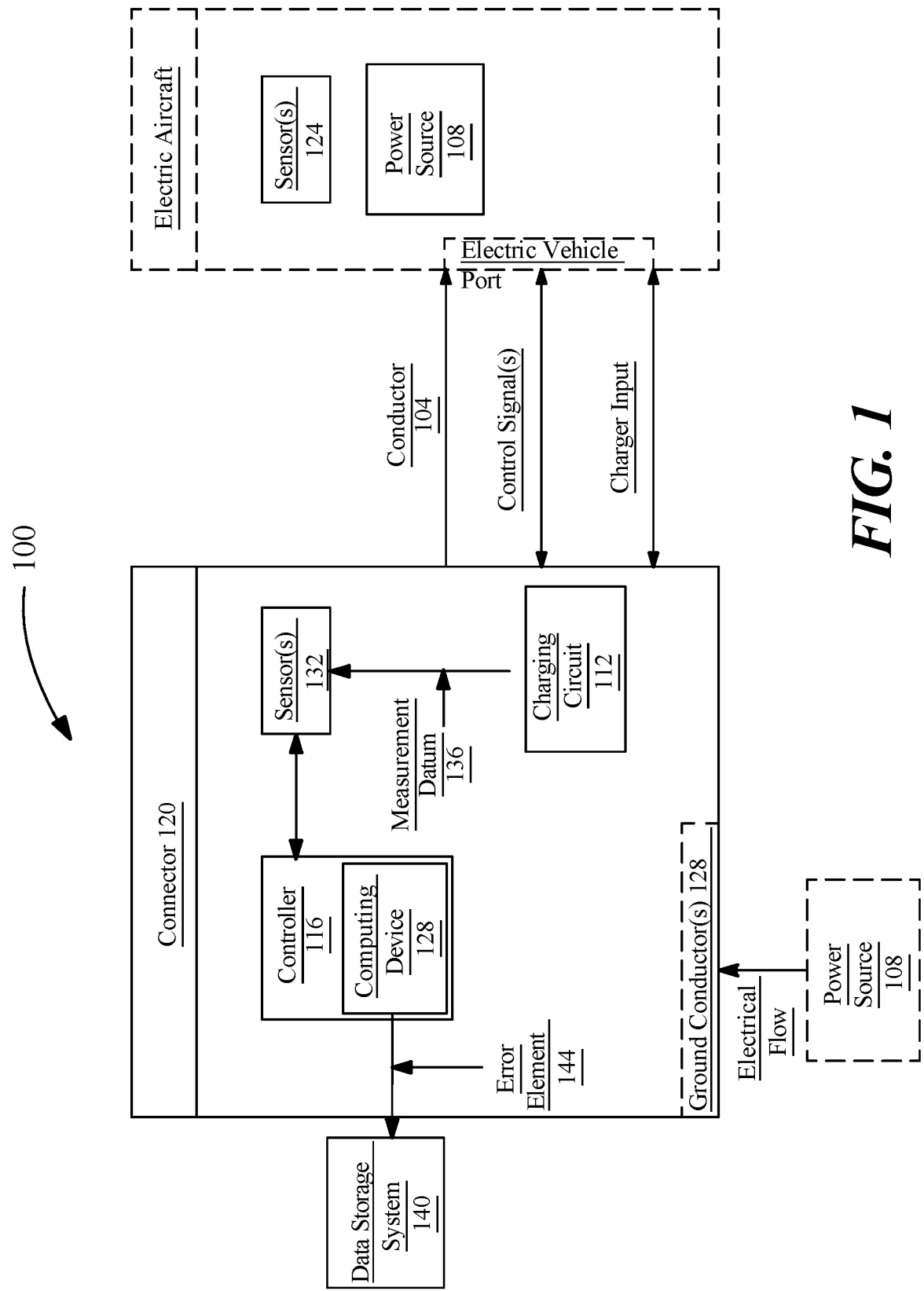
FIG. 1 is a block diagram of an exemplary system for a connector for charging an electric vehicle.

Referring now to FIG. 1, system 100 may include one or more conductors 104 having a distal end approximately located within electric aircraft. As used in this disclosure, a "conductor" is a component that facilitates conduction. As used in this disclosure, "conduction" is a process by which one or more of heat and/or electricity is transmitted through a substance, for example when there is a difference of effort (i.e., temperature or electrical potential) between adjoining regions. In some cases, a conductor 104 may be configured to charge and/or recharge an electric vehicle. For instance, conductor 104 may be connected to a power source 108 and conductor may be designed and/or configured to facilitate a specified amount of electrical power, current, or current type. For example, a conductor 104 may include a direct current conductor. As used in this disclosure, a "direct current conductor" is a conductor configured to carry a direct current for recharging a power source 108. As used in this disclosure, "direct current" is one-directional flow of electric charge. In some cases, a conductor 104 may include an alternating current conductor. As used in this disclosure, an "alternating current conductor" is a conductor configured to carry an alternating current for recharging a power source 108. As used in this disclosure, an "alternating current" is a flow of electric charge that periodically reverse direction; in some cases, an alternating current may change its magnitude continuously with in time (e.g., sine wave).

Still referring to FIG. 1, embodiments of system 100 may include a charging circuit 112. As defined in this disclosure, "charging circuit" may be defined as including anything charging or being charged, from batteries of charging station to batteries of aircraft. The charging circuit also includes components that are involved in charging the battery of the electric vehicle. Examples of components of the charging circuit 112 include but is not limited to power source, batteries, conductors, sensors, power source, electric vehicle ports, connectors, ground conductors, and the like.

Still referring to FIG. 1, charging circuit 112 may include power source 108. Power supply 108 may be configured to provide an electrical flow or current to connector 120, controller 116 and/or remote controller. As used in this disclosure, a "power source" is a source that supplies electrical power, for example for charging a battery. In some cases, power source 108 may include a charging battery (i.e., a battery used for charging other batteries). A charging battery is notably contrasted with an electric vehicle or electric aircraft battery, which is located for example upon an electric aircraft. Charging battery of power source 108 may include a plurality of batteries, battery modules, and/or battery cells. Charging battery of power source may be configured to store a range of electrical energy, for example a range of between about 5 KWh and about 5,000 KWh. Power source 108 may house a variety of electrical components. In one embodiment, power source 108 may contain a solar inverter. Solar inverter may be configured to produce on-site power generation. In one embodiment, power generated from solar inverter may be stored in a charging battery. In some embodiments, charging battery of power source may include a used electric vehicle battery no longer fit for service in a vehicle. Charging battery of power source may include any battery described in this disclosure.

In some embodiments, and still referring to FIG. 1, power source 108 may have a continuous power rating of at least 350 kVA. In other embodiments, power source 108 may have a continuous power rating of over 350 kVA. In some embodiments, power source 108 may have a battery charge range up to 950 Vdc. In other embodiments, power source 108 may have a battery charge range of over 950 Vdc. In some embodiments, power source 108 may have a continuous charge current of at least 350 amps. In other embodiments, power source 108 may have a continuous charge current of over 350 amps. In some embodiments, power source 108 may have a boost charge current of at least 500 amps. In other embodiments, power source 108 may have a boost charge current of over 500 amps. In some embodiments, power source 108 may include any component with the capability of recharging an energy source of an electric vehicle or aircraft. In some embodiments, power source 108 may include a constant voltage charger, a constant current charger, a taper current charger, a pulsed current charger, a negative pulse charger, an IUI charger, a trickle charger, and a float charger.

With continued reference to FIG. 1, in some cases, power source 108 may include one or electrical components configured to control flow of an electric recharging current or switches, relays, direct current to direct current (DC-DC) converters, and the like. In some cases, power source 108 may include one or more circuits configured to provide a variable current source to provide electric recharging current, for example an active current source. Non-limiting examples of active current sources include active current sources without negative feedback, such as current-stable nonlinear implementation circuits, following voltage implementation circuits, voltage compensation implementation circuits, and current compensation implementation circuits, and current sources with negative feedback, including simple transistor current sources, such as constant currant diodes, Zener diode current source circuits, LED current source circuits, transistor current, and the like, Op-amp current source circuits, voltage regulator circuits, and capacitor tubes, to name a few. In some cases, one or more circuits within power source 108 or within communication with supply 108 may be configured to affect electrical recharging current according to a control signal from a controller (e.g. controller 116), such that the controller may control at least a parameter of electrical charging current or voltage. For example, in some cases, controller may control one or more of current (Amps), potential (Volts), and/or power (Watts) of electrical charging current or voltage by way of control signal. In some cases, controller may be configured to selectively engage electrical charging current or voltage, for example ON or OFF by way of a control signal.

Still referring to FIG. 1, in some cases, an AC-DC converter may be used to recharge a charging battery of power source 108. In some cases, AC-DC converter may be used to provide electrical power to power source 108. In some embodiments, power source 108 may have a connection to a grid power component. Grid power component may be connected to an external electrical power grid. In some embodiments, grid power component may be configured to slowly charge one or more batteries (e.g. of power source 108) in order to reduce strain on nearby electrical power grids. In one embodiment, grid power component may have an AC grid current of at least 450 amps. In some embodiments, grid power component may have an AC grid current of more or less than 450 amps. In one embodiment, grid power component may have an AC voltage connection of 480 Vac. In other embodiments, grid power component may have an AC voltage connection of above or below 480 Vac. In some embodiments, power source 108 may provide power to the grid power component. In this configuration, power source 108 may provide power to a surrounding electrical power grid. Certain features including structure and electronic configuration of charging stations and power supplies (sources) which may efficaciously be used in conjunction with some embodiments of the present disclosure are disclosed in U.S. Nonprovisional application Ser. No. 17/405,840, filed on Aug. 18, 2021, entitled "CONNECTOR AND METHODS OF USE FOR CHARGING AN ELECTRIC VEHICLE,".

With continued reference to FIG. 1, the charging circuit 112 may include, but not limited to, an electric vehicle recharging station, electric recharging point, charging point, charge point, electronic charging station, and electric vehicle supply equipment. For instance, and without limitation, electric vehicle recharging component may be consistent with disclosure of electric vehicle recharging component in U.S. patent application Ser. No. 17/361,911 and titled "RECHARGING STATION FOR ELECTRIC AIRCRAFTS AND A METHOD OF ITS USE", which is incorporated herein by reference in its entirety.

With continued reference to FIG. 1, the charging circuit 112 may also include, but not limited to, a battery for an electric vehicle, a pack monitoring unit for the aircraft battery, and a communication component between the Pack monitoring unit and the batter. For instance, and without limitation, pack monitoring unit may be consistent with disclosure of electric vehicle recharging component in U.S. patent application Ser. No. 17/529,583 and titled "PACK MONITORING UNIT FOR AN ELECTRIC AIRCRAFT BATTERY PACK AND METHODS OF USE FOR BATTERY MANAGEMENT", which is incorporated herein by reference in its entirety.

With continued reference to FIG. 1, the charging circuit 112 may additionally include, but not limited to, a module monitoring unit for an electric aircraft battery. For instance, and without limitation, electric vehicle recharging component may be consistent with disclosure of module monitoring unit in U.S. patent application Ser. No. 17/529,447 and titled "MODULE MONITOR UNIT FOR AN ELECTRIC AIRCRAFT BATTERY PACK AND METHODS OF USE", which is incorporated herein by reference in its entirety.

Still referring to FIG. 1, in some embodiments of system 100, the charging circuit 112 may include ground conductor(s) 124. As used in this disclosure, a "ground conductor" is a conductor configured to be in electrical communication with a ground. As used in this disclosure, a "ground" is a reference point in an electrical circuit, a common return path for electric current, or a direct physical connection to the earth. Ground may include an absolute ground such as earth or ground may include a relative (or reference) ground, for example in a floating configuration. Ground conductor 124 functions to provide a grounding or earthing path, for example, for any abnormal, excess or stray electricity or electrical flow.

With continued reference to FIG. 1, in some embodiments of system 100 includes a controller 116. Controller 116 may be communicatively connected to Connector 120 and/or any of its components. Controller 116 may include any computing device as described in this disclosure, including without limitation a microcontroller, microprocessor, digital signal processor (DSP) and/or system on a chip (SoC) as described in this disclosure. Computing device 128 may include, be included in, and/or communicate with a mobile device such as a mobile telephone or smartphone. Computing device 128 may include a single computing device operating independently, or may include two or more computing device operating in concert, in parallel, sequentially or the like; two or more computing devices may be included together in a single computing device or in two or more computing devices. Computing device 128 may interface or communicate with one or more additional devices as described below in further detail via a network interface device. Network interface device may be utilized for connecting computing device to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Computing device may include but is not limited to, for example, a computing device or cluster of computing devices in a first location and a second computing device or cluster of computing devices in a second location. Computing device128 may include one or more computing devices dedicated to data storage, security, distribution of traffic for load balancing, and the like. Computing device 128 may distribute one or more computing tasks as described below across a plurality of computing devices of computing device, which may operate in parallel, in series, redundantly, or in any other manner used for distribution of tasks or memory between computing devices. Computing device 128 may be implemented using a "shared nothing" architecture in which data is cached at the worker, in an embodiment, this may enable scalability of system 100 and/or computing device.

With continued reference to FIG. 1, computing device 128 may be designed and/or configured to perform any method, method step, or sequence of method steps in any embodiment described in this disclosure, in any order and with any degree of repetition. For instance, computing device may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Computing device may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 1, in some embodiments, at least a sensor 132 is configured to detect collect measurement datum from the charging circuit 112. For the purposes of this disclosure, "measurement datum" is an electronic signal representing an information and/or a parameter of a detected electrical and/or physical characteristic and/or phenomenon correlated with a state of a charging circuit 112 which includes all elements/parts relating to charging the electric vehicle including battery. Measurement datum may also include a measurement of resistance, current, voltage, moisture, and temperature. Measurement datum may also include information regarding the degradation or failure of a component of the charging circuit 112.

Still referring to FIG. 1, as used in this disclosure, a "sensor" is a device that is configured to detect a phenomenon and transmit information related to the detection of the phenomenon. For example, in some cases a sensor may transduce a detected phenomenon, such as without limitation, voltage, current, speed, direction, force, torque, resistance, moisture temperature, pressure, and the like, into a sensed signal. Sensor may include one or more sensors which may be the same, similar or different. Sensor may include a plurality of sensors which may be the same, similar or different. Sensor may include one or more sensor suites with sensors in each sensor suite being the same, similar or different.

Still referring to FIG. 1, sensor(s) 132 may include any number of suitable sensors which may be efficaciously used to detect measurement datum 136. For example, and without limitation, these sensors may include a voltage sensor, current sensor, multimeter, voltmeter, ammeter, electrical current sensor, resistance sensor, impedance sensor, capacitance sensor, a Wheatstone bridge, displacements sensor, vibration sensor, Daly detector, electroscope, electron multiplier, Faraday cup, galvanometer, Hall effect sensor, Hall probe, magnetic sensor, optical sensor, magnetometer, magnetoresistance sensor, MEMS magnetic field sensor, metal detector, planar Hall sensor, thermal sensor, and the like, among others. Sensor(s) 132 may efficaciously include, without limitation, any of the sensors disclosed in the entirety of the present disclosure.

With continued reference to FIG. 1, system 100 includes data storage system 136. Data storage system 140 is configured to store a plurality of error elements 144 and/or measurement datum 136. Data storage system 140 may include a database. Data storage system 140 may include a solid-state memory or tape hard drive. Data storage system 140 is communicatively coupled to controller 116 and configured to receive electrical signals related to physical or electrical phenomenon measured and store those electrical signals. Alternatively, Data storage system 140 may include more than one discrete data storage systems that are physically and electrically isolated from each other.

Referring again to FIG. 1, Data storage system 140 may store a plurality of error elements 144. As used in this disclosure, an "error element" is a function of the operating condition of the charging circuit 112. The error element could also be identified by comparing the charging input to a preconfigured threshold. Error elements 144 may include any measurement datum 136, the condition and status of the component parts of the charging circuit 112. The error elements may include total energy flowed through the charging circuit 112. Data storage system 140 may be communicatively coupled to sensors that detect, measure and store energy in a plurality of measurements which may include current, voltage, resistance, impedance, coulombs, watts, temperature, or a combination thereof. Additionally or alternatively, Data storage system 140 may be communicatively coupled to a sensor suite consistent with this disclosure to measure physical and/or electrical characteristics. Data storage system 140 may be configured to store measurement datum wherein at least a portion of the data includes charging circuit 112 maintenance history. Measurement Datum of the battery may include mechanical failures and technician resolutions thereof, electrical failures and technician resolutions thereof. Additionally, charging circuit 112 maintenance history may include component failures such that the overall system still functions. Data storage system 140 may store measurement datum data that includes an upper voltage threshold and lower voltage threshold consistent with this disclosure. Measurement datum 136 may include a moisture level threshold. The moisture level threshold may include an absolute, relative, and/or specific moisture level threshold.

Referring again to FIG. 1, Data storage system 140 may store error elements remotely. For. As used in this disclosure, "remote" is a spatial separation between two or more elements, systems, components, or devices. Stated differently, two elements may be remote from one another if they are physically spaced apart. For example, and without limitation, Data storage system 140 may transmit an alert to a user interface, such as a display, of an electric aircraft to indicate to a user that a critical event element has been determined. In one or more embodiments, Data storage system 140 may also use transmit an alert to a remote user device, such as a laptop, mobile device, tablet, or the like.

Figure 2:
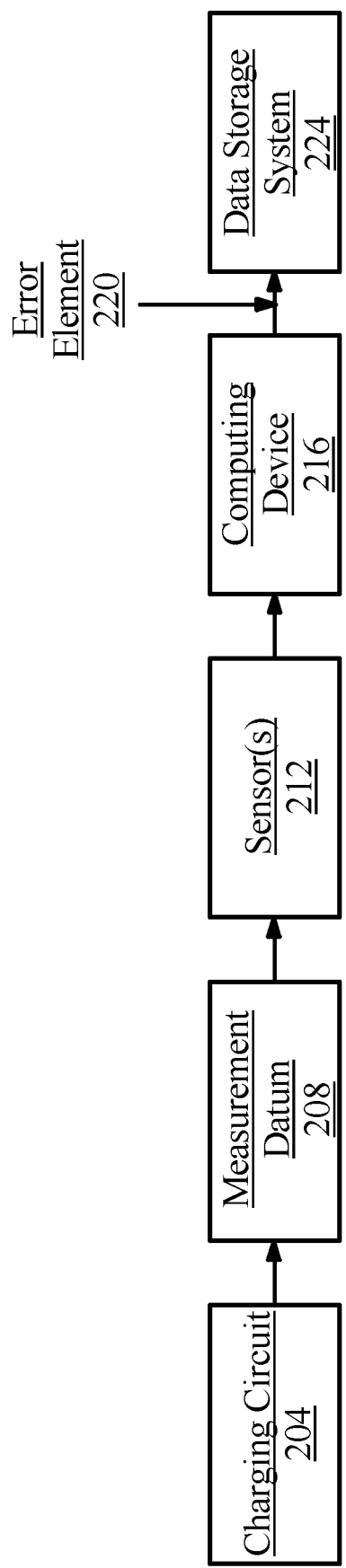
FIG. 2 is a flow diagram illustrating a method of process of recording and storing error elements.

Referring now to FIG. 2, is a flow chart that embodies the process of recording and storing error elements. As used in this disclosure, the "charging circuit" are all the components that are required to charge the electric vehicle. The charging circuit 204 includes but is not limited to a battery, power source, connectors, housings, conductors, electric vehicle port, and control signals. Measurement datum 208 may include a measurement of resistance, current, voltage, moisture, and temperature. Measurement datum 208 may also include information regarding the degradation or failure of a component of the charging circuit 204. The sensors 212 may be configured to detect measurement datum regarding the various components of the charging circuit 204. Sensors 212 as used in the current disclosure may be a sensor as it was defined in any of FIGS. 1-7. In certain embodiments of system 200 there may be multiple sensors 212 configured to detect measurement datum 208 at multiple points though out the charging circuit 204. Sensor 212 will be communicatively connected with computing device 216. Computing device 216 may be any computing device that has been disclosed in FIGS. 1-7. Computing device 216 will be configured to evaluate the various datum points against a predetermined set of values to decide the operating condition of the system. As used in the current disclosure, "operating condition" is an evaluation of the status of any part in charging circuit. In some embodiments of computing device 216 will also compare the measurement datum against previous measurement datum to determine the operating condition of the system. Once the computing device 216 decides the operating condition, any unusual operating conditions will then become an Error Element 220. All error elements are stored within the data storage system 224. Data storage system 224 may include any data storage system from FIG. 1-7.

Figure 3:
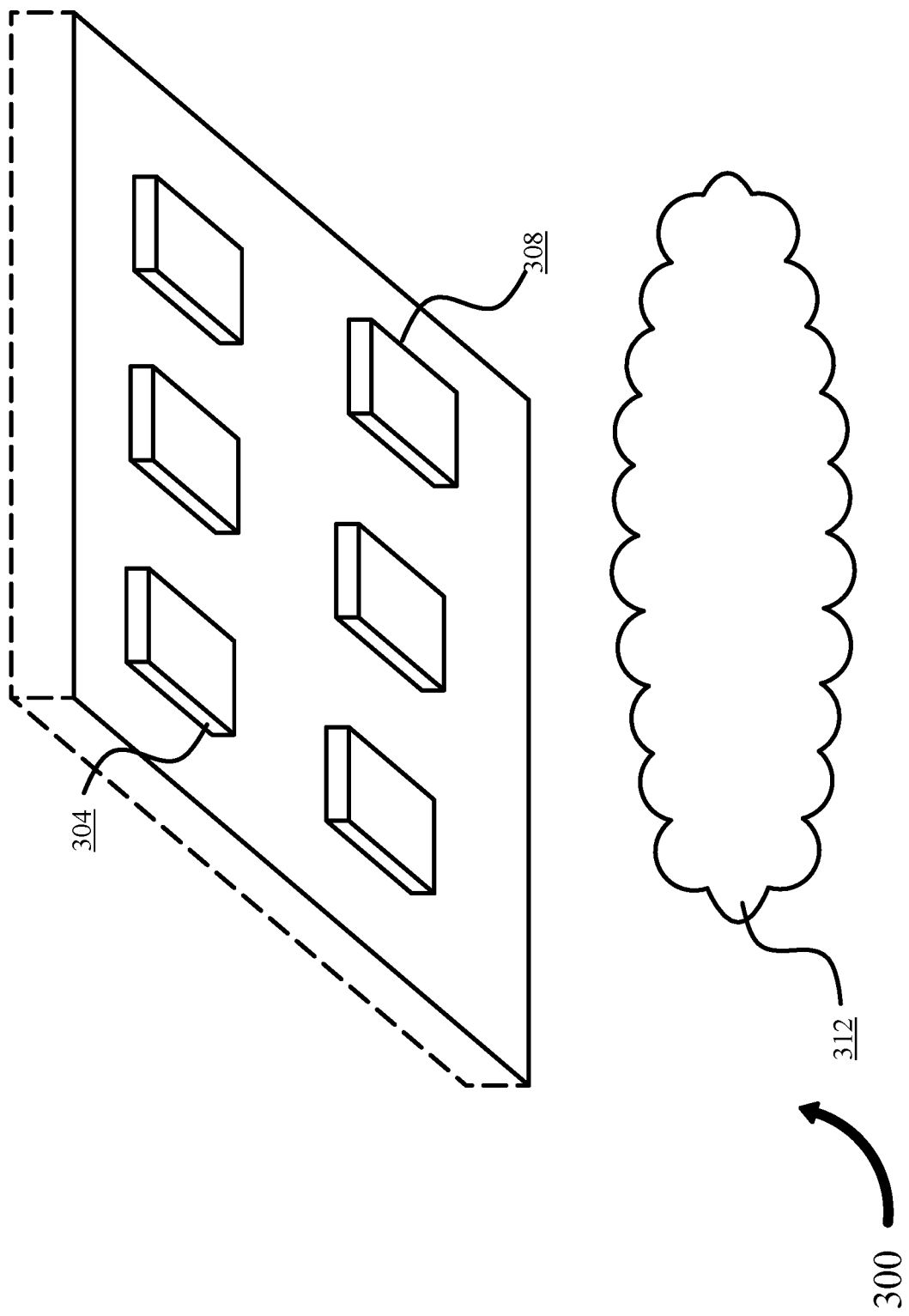
FIG. 3 is a block diagram illustrating an exemplary sensor suite.

Referring now to FIG. 3, an embodiment of sensor suite 300 is presented. The herein disclosed system and method may comprise a plurality of sensors in the form of individual sensors or a sensor suite working in tandem or individually. In some cases, sensor suite 300 may communicate by way of at least a conductor 104, such as within limitation a control signal conductor. Alternatively and/or additionally, in some cases, sensor suite 300 may be communicative by at least a network, for example any network described in this disclosure including wireless (Wi-Fi), controller area network (CAN), the Internet, and the like. A sensor suite may include a plurality of independent sensors, as described herein, where any number of the described sensors may be used to detect any number of physical or electrical quantities associated with a vehicle battery or an electrical energy storage system, such as without limitation charging battery. Independent sensors may include separate sensors measuring physical or electrical quantities that may be powered by and/or in communication with circuits independently, where each may signal sensor output to a control circuit such as a user graphical interface. In a non-limiting example, there may be four independent sensors housed in and/or on battery pack measuring temperature, electrical characteristic such as voltage, amperage, resistance, or impedance, or any other parameters and/or quantities as described in this disclosure. In an embodiment, use of a plurality of independent sensors may result in redundancy configured to employ more than one sensor that measures the same phenomenon, those sensors being of the same type, a combination of, or another type of sensor not disclosed, so that in the event one sensor fails, the ability of controller 103 and/or user to detect phenomenon is maintained.

With continued reference to FIG. 3, sensor suite 300 may include a humidity sensor 304. Humidity, as used in this disclosure, is the property of a gaseous medium (almost always air) to hold water in the form of vapor. An amount of water vapor contained within a parcel of air can vary significantly. Water vapor is generally invisible to the human eye and may be damaging to electrical components. There are three primary measurements of humidity, absolute, relative, specific humidity. "Absolute humidity," for the purposes of this disclosure, describes the water content of air and is expressed in either grams per cubic meters or grams per kilogram. "Relative humidity", for the purposes of this disclosure, is expressed as a percentage, indicating a present stat of absolute humidity relative to a maximum humidity given the same temperature. "Specific humidity", for the purposes of this disclosure, is the ratio of water vapor mass to total moist air parcel mass, where parcel is a given portion of a gaseous medium. Humidity sensor 304 may be psychrometer. Humidity sensor 304 may be a hygrometer. Humidity sensor 304 may be configured to act as or include a humidistat. A "humidistat", for the purposes of this disclosure, is a humidity-triggered switch, often used to control another electronic device. Humidity sensor 304 may use capacitance to measure relative humidity and include in itself, or as an external component, include a device to convert relative humidity measurements to absolute humidity measurements. "Capacitance", for the purposes of this disclosure, is the ability of a system to store an electric charge, in this case the system is a parcel of air which may be near, adjacent to, or above a battery cell.

With continued reference to FIG. 3, sensor suite 300 may include multimeter 308. Multimeter 308 may be configured to measure voltage across a component, electrical current through a component, and resistance of a component. Multimeter 308 may include separate sensors to measure each of the previously disclosed electrical characteristics such as voltmeter, ammeter, and ohmmeter, respectively.

Alternatively or additionally, and with continued reference to FIG. 3, sensor suite 300 may include a sensor or plurality thereof that may detect voltage and direct charging of individual battery cells according to charge level; detection may be performed using any suitable component, set of components, and/or mechanism for direct or indirect measurement and/or detection of voltage levels, including without limitation comparators, analog to digital converters, any form of voltmeter, or the like. Sensor suite 300 and/or a control circuit incorporated therein and/or communicatively connected thereto may be configured to adjust charge to one or more battery cells as a function of a charge level and/or a detected parameter. For instance, and without limitation, sensor suite 300 may be configured to determine that a charge level of a battery cell is high based on a detected voltage level of that battery cell or portion of the battery pack. Sensor suite 300 may alternatively or additionally detect a charge reduction event, defined for purposes of this disclosure as any temporary or permanent state of a battery cell requiring reduction or cessation of charging; a charge reduction event may include a cell being fully charged and/or a cell undergoing a physical and/or electrical process that makes continued charging at a current voltage and/or current level inadvisable due to a risk that the cell will be damaged, will overheat, or the like. Detection of a charge reduction event may include detection of a temperature, of the cell above a threshold level, detection of a voltage and/or resistance level above or below a threshold, or the like. Sensor suite 300 may include digital sensors, analog sensors, or a combination thereof. Sensor suite 300 may include digital-to-analog converters (DAC), analog-to-digital converters (ADC, A/D, A-to-D), a combination thereof, or other signal conditioning components used in transmission of a battery sensor signal to a destination over wireless or wired connection.

With continued reference to FIG. 3, sensor suite 300 may include thermocouples, thermistors, thermometers, passive infrared sensors, resistance temperature sensors (RTD's), semiconductor based integrated circuits (IC), a combination thereof or another undisclosed sensor type, alone or in combination. Temperature, for the purposes of this disclosure, and as would be appreciated by someone of ordinary skill in the art, is a measure of the heat energy of a system. Temperature, as measured by any number or combinations of sensors present within sensor suite 300, may be measured in Fahrenheit (° F.), Celsius (° C.), Kelvin (° K), or another scale alone or in combination. The temperature measured by sensors may comprise electrical signals which are transmitted to their appropriate destination wireless or through a wired connection.

With continued reference to FIG. 3, sensor suite 300 may include a sensor configured to detect gas that may be emitted during or after a catastrophic cell failure. "Catastrophic cell failure", for the purposes of this disclosure, refers to a malfunction of a battery cell, which may be an electrochemical cell, that renders the cell inoperable for its designed function, namely providing electrical energy to at least a portion of an electric aircraft. Byproducts of catastrophic cell failure 312 may include gaseous discharge including oxygen, hydrogen, carbon dioxide, methane, carbon monoxide, a combination thereof, or another undisclosed gas, alone or in combination. Further the sensor configured to detect vent gas from electrochemical cells may comprise a gas detector. For the purposes of this disclosure, a "gas detector" is a device used to detect a gas is present in an area. Gas detectors, and more specifically, the gas sensor that may be used in sensor suite 300, may be configured to detect combustible, flammable, toxic, oxygen depleted, a combination thereof, or another type of gas alone or in combination. The gas sensor that may be present in sensor suite 300 may include a combustible gas, photoionization detectors, electrochemical gas sensors, ultrasonic sensors, metal-oxide-semiconductor (MOS) sensors, infrared imaging sensors, a combination thereof, or another undisclosed type of gas sensor alone or in combination. Sensor suite 300 may include sensors that are configured to detect non-gaseous byproducts of catastrophic cell failure 312 including, in non-limiting examples, liquid chemical leaks including aqueous alkaline solution, ionomer, molten phosphoric acid, liquid electrolytes with redox shuttle and ionomer, and salt water, among others. Sensor suite 300 may include sensors that are configured to detect non-gaseous byproducts of catastrophic cell failure 312 including, in non-limiting examples, electrical anomalies as detected by any of the previous disclosed sensors or components.

With continued reference to FIG. 3, sensor suite 300 may be configured to detect events where voltage nears an upper voltage threshold or lower voltage threshold. The upper voltage threshold may be stored in data storage system for comparison with an instant measurement taken by any combination of sensors present within sensor suite 300. The upper voltage threshold may be calculated and calibrated based on factors relating to battery cell health, maintenance history, location within battery pack, designed application, and type, among others. Sensor suite 300 may measure voltage at an instant, over a period of time, or periodically. Sensor suite 300 may be configured to operate at any of these detection modes, switch between modes, or simultaneous measure in more than one mode. Controller may detect through sensor suite 300 events where voltage nears the lower voltage threshold. The lower voltage threshold may indicate power loss to or from an individual battery cell or portion of the battery pack. Controller may detect through sensor suite 300 events where voltage exceeds the upper and lower voltage threshold. Events where voltage exceeds the upper and lower voltage threshold may indicate battery cell failure or electrical anomalies that could lead to potentially dangerous situations for aircraft and personnel that may be present in or near its operation.

With continued reference to FIG. 3, in some cases, sensor suite 300 may include a swell sensor configured to sense swell, pressure, or strain of at least a battery cell. In some cases, battery cell swell, pressure, and/or strain may be indicative of an amount of gases and/or gas expansion within a battery cell. Battery swell sensor may include one or more of a pressure sensor, a load cell, and a strain gauge. In some cases, battery swell sensor may output a battery swell signal that is analog and requires signal processing techniques. For example, in some cases, wherein battery swell sensor includes at least a strain gauge, battery swell signal may be processed and digitized by one or more of a Wheatstone bridge, an amplifier, a filter, and an analog to digital converter. In some cases, battery sensor signal may include battery swell signal.

Figure 4:
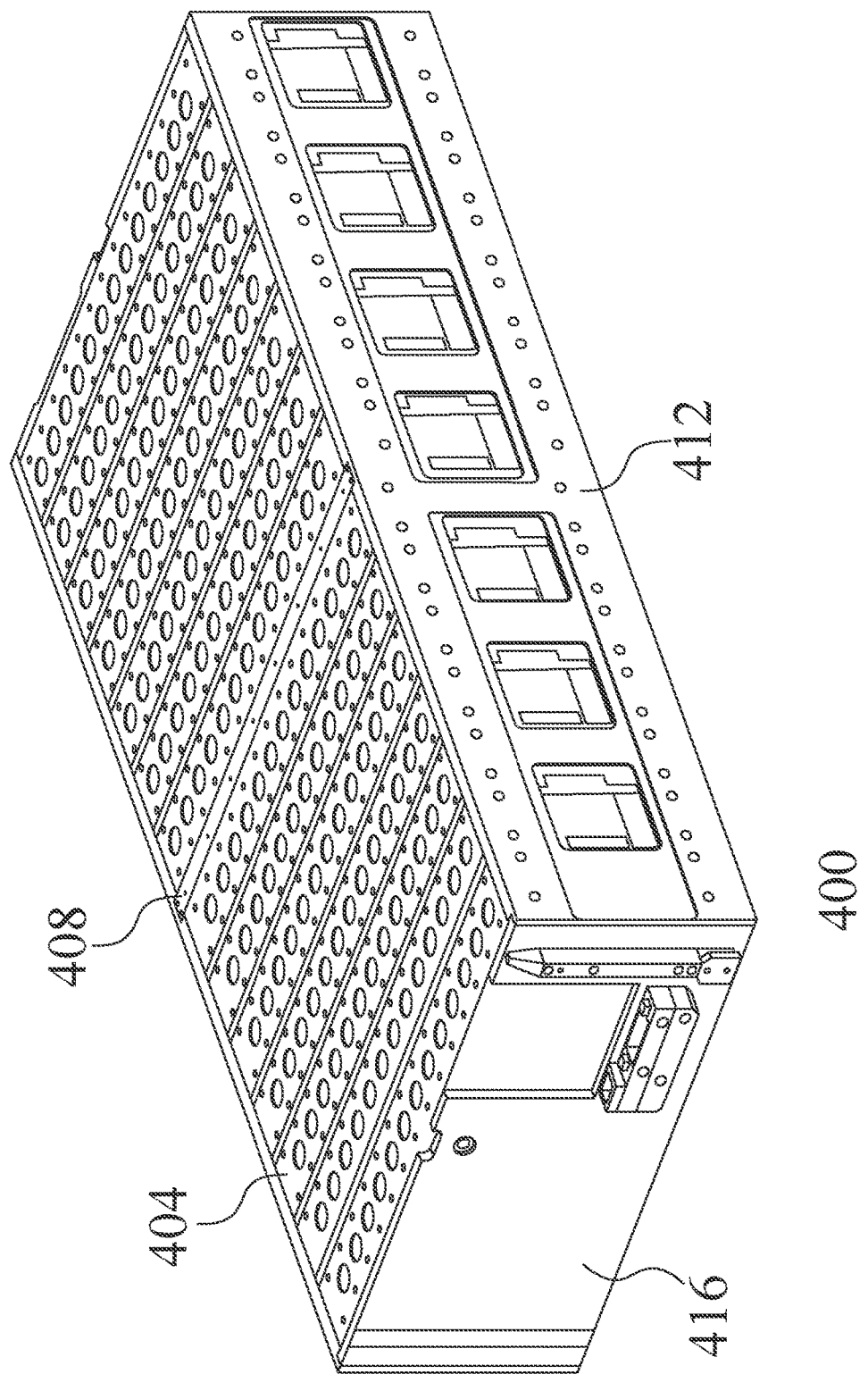
FIG. 4 is a front view embodiment of an exemplary embodiment of a battery pack.

FIG. 4 illustrates an exemplary embodiment of a battery pack 400 that may be housed in the power storage unit to store power. Battery pack 400 may be a power storing device that is configured to store electrical energy in the form of a plurality of battery modules, which themselves may be comprised of a plurality of electrochemical cells. These cells may utilize electrochemical cells, galvanic cells, electrolytic cells, fuel cells, flow cells, and/or voltaic cells. In general, an electrochemical cell is a device capable of generating electrical energy from chemical reactions or using electrical energy to cause chemical reactions. Voltaic or galvanic cells are electrochemical cells that generate electric current from chemical reactions, while electrolytic cells generate chemical reactions via electrolysis. In general, the term 'battery' is used as a collection of cells connected in series or parallel to each other. A battery cell may, when used in conjunction with other cells, be electrically connected in series, in parallel or a combination of series and parallel. Series connection comprises wiring a first terminal of a first cell to a second terminal of a second cell and further configured to comprise a single conductive path for electricity to flow while maintaining the same current (measured in Amperes) through any component in the circuit. A battery cell may use the term 'wired', but one of ordinary skill in the art would appreciate that this term is synonymous with 'electrically connected', and that there are many ways to couple electrical elements like battery cells together. An example of a connector that does not comprise wires may be prefabricated terminals of a first gender that mate with a second terminal with a second gender. Battery cells may be wired in parallel. Parallel connection comprises wiring a first and second terminal of a first battery cell to a first and second terminal of a second battery cell and further configured to comprise more than one conductive path for electricity to flow while maintaining the same voltage (measured in Volts) across any component in the circuit. Battery cells may be wired in a series-parallel circuit which combines characteristics of the constituent circuit types to this combination circuit. Battery cells may be electrically connected in a virtually unlimited arrangement which may confer onto the system the electrical advantages associated with that arrangement such as high-voltage applications, high current applications, or the like. In an exemplary embodiment, battery pack 400 may include at least 196 battery cells in series and at least 18 battery cells in parallel. This is, as someone of ordinary skill in the art would appreciate, only an example and battery pack 400 may be configured to have a near limitless arrangement of battery cell configurations.

With continued reference to FIG. 4, battery pack 400 may include a plurality of battery modules 404. The battery modules may be wired together in series and in parallel. Battery pack 400 may include a center sheet 408 which may include a thin barrier. The barrier may include a fuse connecting battery modules on either side of center sheet 408. The fuse may be disposed in or on center sheet 408 and configured to connect to an electric circuit comprising a first battery module and therefore battery unit and cells. In general, and for the purposes of this disclosure, a fuse is an electrical safety device that operate to provide overcurrent protection of an electrical circuit. As a sacrificial device, its essential component is metal wire or strip that melts when too much current flows through it, thereby interrupting energy flow. The fuse may comprise a thermal fuse, mechanical fuse, blade fuse, expulsion fuse, spark gap surge arrestor, varistor, or a combination thereof.

Battery pack 400 may also include a side wall 412 which may include a laminate of a plurality of layers configured to thermally insulate the plurality of battery modules 404 from external components of battery pack 400. Side wall 412 layers may include materials which possess characteristics suitable for thermal insulation such as fiberglass, air, iron fibers, polystyrene foam, and thin plastic films. Side wall 412 may additionally or alternatively electrically insulate the plurality of battery modules 404 from external components of battery pack 400 and the layers of which may include polyvinyl chloride (PVC), glass, asbestos, rigid laminate, varnish, resin, paper, Teflon, rubber, and mechanical lamina. Center sheet 408 may be mechanically coupled to side wall 412. Side wall 412 may include a feature for alignment and coupling to center sheet 408. This feature may comprise a cutout, slots, holes, bosses, ridges, channels, and/or other undisclosed mechanical features, alone or in combination.

Battery pack 400 may also include an end panel 416 having a plurality of electrical connectors and further configured to fix battery pack 400 in alignment with at least a side wall 412. End panel 416 may include a plurality of electrical connectors of a first gender configured to electrically and mechanically couple to electrical connectors of a second gender. End panel 416 may be configured to convey electrical energy from battery cells to at least a portion of an eVTOL aircraft. Electrical energy may be configured to power at least a portion of an eVTOL aircraft or comprise signals to notify aircraft computers, personnel, users, pilots, and any others of information regarding battery health, emergencies, and/or electrical characteristics. The plurality of electrical connectors may comprise blind mate connectors, plug and socket connectors, screw terminals, ring and spade connectors, blade connectors, and/or an undisclosed type alone or in combination. The electrical connectors of which end panel 416 comprises may be configured for power and communication purposes.

A first end of end panel 416 may be configured to mechanically couple to a first end of a first side wall 412 by a snap attachment mechanism, similar to end cap and side panel configuration utilized in the battery module. To reiterate, a protrusion disposed in or on end panel 416 may be captured, at least in part, by a receptacle disposed in or on side wall 412. A second end of end panel 416 may be mechanically coupled to a second end of a second side wall 412 in a similar or the same mechanism.

Figure 5:
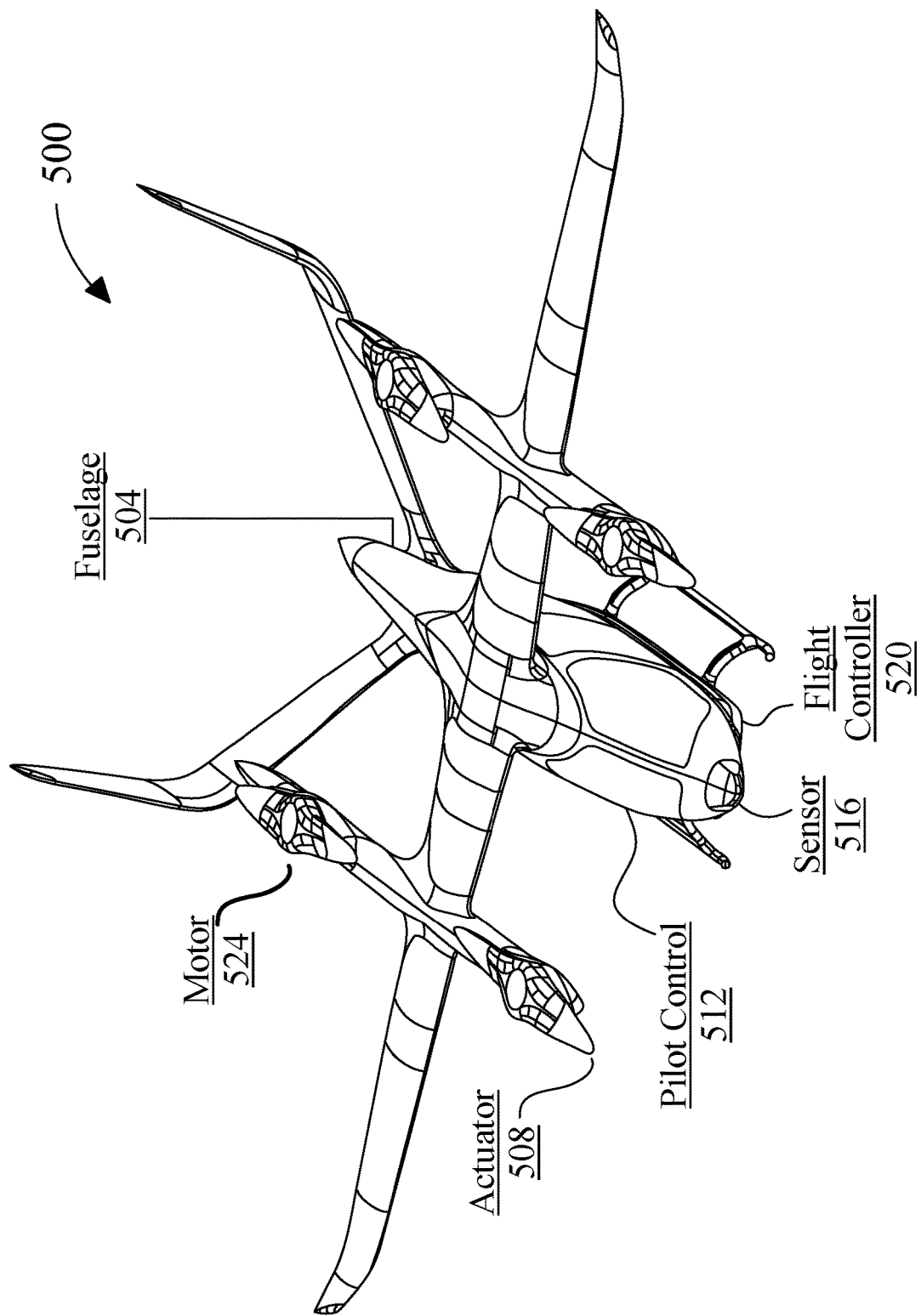
FIG. 5 is a schematic of an exemplary electric aircraft.

Referring now to FIG. 5, an exemplary embodiment of an aircraft 500 is illustrated. Aircraft 500 may include an electrically powered aircraft (i.e., electric aircraft). In some embodiments, electrically powered aircraft may be an electric vertical takeoff and landing (eVTOL) aircraft. Electric aircraft may be capable of rotor-based cruising flight, rotor-based takeoff, rotor-based landing, fixed-wing cruising flight, airplane-style takeoff, airplane-style landing, and/or any combination thereof. "Rotor-based flight," as described in this disclosure, is where the aircraft generated lift and propulsion by way of one or more powered rotors coupled with an engine, such as a quadcopter, multi-rotor helicopter, or other vehicle that maintains its lift primarily using downward thrusting propulsors. "Fixed-wing flight," as described in this disclosure, is where the aircraft is capable of flight using wings and/or foils that generate lift caused by the aircraft's forward airspeed and the shape of the wings and/or foils, such as airplane-style flight.

Still referring to FIG. 5, aircraft 500 may include a fuselage 504. As used in this disclosure a "fuselage" is the main body of an aircraft, or in other words, the entirety of the aircraft except for the cockpit, nose, wings, empennage, nacelles, any and all control surfaces, and generally contains an aircraft's payload. Fuselage 504 may comprise structural elements that physically support the shape and structure of an aircraft. Structural elements may take a plurality of forms, alone or in combination with other types. Structural elements may vary depending on the construction type of aircraft and specifically, the fuselage. Fuselage 504 may comprise a truss structure. A truss structure may be used with a lightweight aircraft and may include welded aluminum tube trusses. A truss, as used herein, is an assembly of beams that create a rigid structure, often in combinations of triangles to create three-dimensional shapes. A truss structure may alternatively comprise titanium construction in place of aluminum tubes, or a combination thereof. In some embodiments, structural elements may comprise aluminum tubes and/or titanium beams. In an embodiment, and without limitation, structural elements may include an aircraft skin. Aircraft skin may be layered over the body shape constructed by trusses. Aircraft skin may comprise a plurality of materials such as aluminum, fiberglass, and/or carbon fiber, the latter of which will be addressed in greater detail later in this paper.

Still referring to FIG. 5, aircraft 500 may include a plurality of actuators 508. Actuator 508 may include any motor and/or propulsor described in this disclosure, for instance in reference to FIGS. 1-12. In an embodiment, actuator 508 may be mechanically coupled to an aircraft. As used herein, a person of ordinary skill in the art would understand "mechanically coupled" to mean that at least a portion of a device, component, or circuit is connected to at least a portion of the aircraft via a mechanical coupling. Said mechanical coupling can include, for example, rigid coupling, such as beam coupling, bellows coupling, bushed pin coupling, constant velocity, split-muff coupling, diaphragm coupling, disc coupling, donut coupling, elastic coupling, flexible coupling, fluid coupling, gear coupling, grid coupling, Hirth joints, hydrodynamic coupling, jaw coupling, magnetic coupling, Oldham coupling, sleeve coupling, tapered shaft lock, twin spring coupling, rag joint coupling, universal joints, or any combination thereof. As used in this disclosure an "aircraft" is vehicle that may fly. As a non-limiting example, aircraft may include airplanes, helicopters, airships, blimps, gliders, paramotors, and the like thereof. In an embodiment, mechanical coupling may be used to connect the ends of adjacent parts and/or objects of an electric aircraft. Further, in an embodiment, mechanical coupling may be used to join two pieces of rotating electric aircraft components.

With continued reference to FIG. 5, a plurality of actuators 508 may be configured to produce a torque. As used in this disclosure a "torque" is a measure of force that causes an object to rotate about an axis in a direction. For example, and without limitation, torque may rotate an aileron and/or rudder to generate a force that may adjust and/or affect altitude, airspeed velocity, groundspeed velocity, direction during flight, and/or thrust. For example, plurality of actuators 508 may include a component used to produce a torque that affects aircrafts' roll and pitch, such as without limitation one or more ailerons. An "aileron," as used in this disclosure, is a hinged surface which form part of the trailing edge of a wing in a fixed wing aircraft, and which may be moved via mechanical means such as without limitation servomotors, mechanical linkages, or the like. As a further example, plurality of actuators 508 may include a rudder, which may include, without limitation, a segmented rudder that produces a torque about a vertical axis. Additionally or alternatively, plurality of actuators 508 may include other flight control surfaces such as propulsors, rotating flight controls, or any other structural features which can adjust movement of aircraft 500. Plurality of actuators 508 may include one or more rotors, turbines, ducted fans, paddle wheels, and/or other components configured to propel a vehicle through a fluid medium including, but not limited to air.

Still referring to FIG. 5, plurality of actuators 508 may include at least a propulsor component. As used in this disclosure a "propulsor component" or "propulsor" is a component and/or device used to propel a craft by exerting force on a fluid medium, which may include a gaseous medium such as air or a liquid medium such as water. In an embodiment, when a propulsor twists and pulls air behind it, it may, at the same time, push an aircraft forward with an amount of force and/or thrust. More air pulled behind an aircraft results in greater thrust with which the aircraft is pushed forward. Propulsor component may include any device or component that consumes electrical power on demand to propel an electric aircraft in a direction or other vehicle while on ground or in-flight. In an embodiment, propulsor component may include a puller component. As used in this disclosure a "puller component" is a component that pulls and/or tows an aircraft through a medium. As a non-limiting example, puller component may include a flight component such as a puller propeller, a puller motor, a puller propulsor, and the like. Additionally, or alternatively, puller component may include a plurality of puller flight components. In another embodiment, propulsor component may include a pusher component. As used in this disclosure a "pusher component" is a component that pushes and/or thrusts an aircraft through a medium. As a non-limiting example, pusher component may include a pusher component such as a pusher propeller, a pusher motor, a pusher propulsor, and the like. Additionally, or alternatively, pusher flight component may include a plurality of pusher flight components.

In another embodiment, and still referring to FIG. 5, propulsor may include a propeller, a blade, or any combination of the two. A propeller may function to convert rotary motion from an engine or other power source into a swirling slipstream which may push the propeller forwards or backwards. Propulsor may include a rotating power-driven hub, to which several radial airfoil-section blades may be attached, such that an entire whole assembly rotates about a longitudinal axis. As a non-limiting example, blade pitch of propellers may be fixed at a fixed angle, manually variable to a few set positions, automatically variable (e.g. a "constant-speed" type), and/or any combination thereof as described further in this disclosure. As used in this disclosure a "fixed angle" is an angle that is secured and/or substantially unmovable from an attachment point. For example, and without limitation, a fixed angle may be an angle of 2.2° inward and/or 1.7° forward. As a further non-limiting example, a fixed angle may be an angle of 3.6° outward and/or 2.7° backward. In an embodiment, propellers for an aircraft may be designed to be fixed to their hub at an angle similar to the thread on a screw makes an angle to the shaft; this angle may be referred to as a pitch or pitch angle which may determine a speed of forward movement as the blade rotates. Additionally or alternatively, propulsor component may be configured having a variable pitch angle. As used in this disclosure a "variable pitch angle" is an angle that may be moved and/or rotated. For example, and without limitation, propulsor component may be angled at a first angle of 3.3° inward, wherein propulsor component may be rotated and/or shifted to a second angle of 1.7° outward.

Still referring to FIG. 5, propulsor may include a thrust element which may be integrated into the propulsor. Thrust element may include, without limitation, a device using moving or rotating foils, such as one or more rotors, an airscrew or propeller, a set of airscrews or propellers such as contra-rotating propellers, a moving or flapping wing, or the like. Further, a thrust element, for example, can include without limitation a marine propeller or screw, an impeller, a turbine, a pump-jet, a paddle or paddle-based device, or the like.

With continued reference to FIG. 5, plurality of actuators 508 may include power sources, control links to one or more elements, fuses, and/or mechanical couplings used to drive and/or control any other flight component. Plurality of actuators 508 may include a motor that operates to move one or more flight control components and/or one or more control surfaces, to drive one or more propulsors, or the like. A motor may be driven by direct current (DC) electric power and may include, without limitation, brushless DC electric motors, switched reluctance motors, induction motors, or any combination thereof. Alternatively or additionally, a motor may be driven by an inverter. A motor may also include electronic speed controllers, inverters, or other components for regulating motor speed, rotation direction, and/or dynamic braking.

Still referring to FIG. 5, plurality of actuators 508 may include an energy source. An energy source may include, for example, a generator, a photovoltaic device, a fuel cell such as a hydrogen fuel cell, direct methanol fuel cell, and/or solid oxide fuel cell, an electric energy storage device (e.g. a capacitor, an inductor, and/or a battery). An energy source may also include a battery cell, or a plurality of battery cells connected in series into a module and each module connected in series or in parallel with other modules. Configuration of an energy source containing connected modules may be designed to meet an energy or power requirement and may be designed to fit within a designated footprint in an electric aircraft in which system may be incorporated.

In an embodiment, and still referring to FIG. 5, an energy source may be used to provide a steady supply of electrical power to a load over a flight by an electric aircraft 500. For example, energy source may be capable of providing sufficient power for "cruising" and other relatively low-energy phases of flight. Energy source may also be capable of providing electrical power for some higher-power phases of flight as well, particularly when the energy source is at a high SOC, as may be the case for instance during takeoff. In an embodiment, energy source may include an emergency power unit which may be capable of providing sufficient electrical power for auxiliary loads including without limitation, lighting, navigation, communications, de-icing, steering or other systems requiring power or energy. Further, energy source may be capable of providing sufficient power for controlled descent and landing protocols, including, without limitation, hovering descent or runway landing. As used herein the energy source may have high power density where electrical power an energy source can usefully produce per unit of volume and/or mass is relatively high. As used in this disclosure, "electrical power" is a rate of electrical energy per unit time. An energy source may include a device for which power that may be produced per unit of volume and/or mass has been optimized, for instance at an expense of maximal total specific energy density or power capacity. Non-limiting examples of items that may be used as at least an energy source include batteries used for starting applications including Li ion batteries which may include NCA, NMC, Lithium iron phosphate (LiFePO4) and Lithium Manganese Oxide (LMO) batteries, which may be mixed with another cathode chemistry to provide more specific power if the application requires Li metal batteries, which have a lithium metal anode that provides high power on demand, Li ion batteries that have a silicon or titanite anode, energy source may be used, in an embodiment, to provide electrical power to an electric aircraft or drone, such as an electric aircraft vehicle, during moments requiring high rates of power output, including without limitation takeoff, landing, thermal de-icing and situations requiring greater power output for reasons of stability, such as high turbulence situations, as described in further detail below. A battery may include, without limitation a battery using nickel based chemistries such as nickel cadmium or nickel metal hydride, a battery using lithium ion battery chemistries such as a nickel cobalt aluminum (NCA), nickel manganese cobalt (NMC), lithium iron phosphate (LiFePO4), lithium cobalt oxide (LCO), and/or lithium manganese oxide (LMO), a battery using lithium polymer technology, lead-based batteries such as without limitation lead acid batteries, metal-air batteries, or any other suitable battery. Persons skilled in the art, upon reviewing the entirety of this disclosure, will be aware of various devices of components that may be used as an energy source.

Still referring to FIG. 5, an energy source may include a plurality of energy sources, referred to herein as a module of energy sources. Module may include batteries connected in parallel or in series or a plurality of modules connected either in series or in parallel designed to satisfy both power and energy requirements. Connecting batteries in series may increase a potential of at least an energy source which may provide more power on demand. High potential batteries may require cell matching when high peak load is needed. As more cells are connected in strings, there may exist a possibility of one cell failing which may increase resistance in module and reduce overall power output as voltage of the module may decrease as a result of that failing cell. Connecting batteries in parallel may increase total current capacity by decreasing total resistance, and it also may increase overall amp-hour capacity. Overall energy and power outputs of at least an energy source may be based on individual battery cell performance or an extrapolation based on a measurement of at least an electrical parameter. In an embodiment where energy source includes a plurality of battery cells, overall power output capacity may be dependent on electrical parameters of each individual cell. If one cell experiences high self-discharge during demand, power drawn from at least an energy source may be decreased to avoid damage to a weakest cell. Energy source may further include, without limitation, wiring, conduit, housing, cooling system and battery management system. Persons skilled in the art will be aware, after reviewing the entirety of this disclosure, of many different components of an energy source. Exemplary energy sources are disclosed in detail in U.S. patent application Ser. Nos. 16/948,157 and 16/048,140 both entitled "SYSTEM AND METHOD FOR HIGH ENERGY DENSITY BATTERY MODULE" by S. Donovan et al., which are incorporated in their entirety herein by reference.

Still referring to FIG. 5, according to some embodiments, an energy source may include an emergency power unit (EPU) (i.e., auxiliary power unit). As used in this disclosure an "emergency power unit" is an energy source as described herein that is configured to power an essential system for a critical function in an emergency, for instance without limitation when another energy source has failed, is depleted, or is otherwise unavailable. Exemplary non-limiting essential systems include navigation systems, such as MFD, GPS, VOR receiver or directional gyro, and other essential flight components, such as propulsors.

Still referring to FIG. 5, another exemplary actuator may include landing gear. Landing gear may be used for take-off and/or landing/Landing gear may be used to contact ground while aircraft 500 is not in flight. Exemplary landing gear is disclosed in detail in U.S. patent application Ser. No. 17/196,719 entitled "SYSTEM FOR ROLLING LANDING GEAR" by R. Griffin et al., which is incorporated in its entirety herein by reference.

Still referring to FIG. 5, aircraft 500 may include a pilot control 512, including without limitation, a hover control, a thrust control, an inceptor stick, a cyclic, and/or a collective control. As used in this disclosure a "collective control" or "collective" is a mechanical control of an aircraft that allows a pilot to adjust and/or control the pitch angle of the plurality of actuators 508. For example and without limitation, collective control may alter and/or adjust the pitch angle of all of the main rotor blades collectively. For example, and without limitation pilot control 512 may include a yoke control. As used in this disclosure a "yoke control" is a mechanical control of an aircraft to control the pitch and/or roll. For example and without limitation, yoke control may alter and/or adjust the roll angle of aircraft 500 as a function of controlling and/or maneuvering ailerons. In an embodiment, pilot control 512 may include one or more footbrakes, control sticks, pedals, throttle levels, and the like thereof. In another embodiment, and without limitation, pilot control 512 may be configured to control a principal axis of the aircraft. As used in this disclosure a "principal axis" is an axis in a body representing one three dimensional orientations. For example, and without limitation, principal axis or more yaw, pitch, and/or roll axis. Principal axis may include a yaw axis. As used in this disclosure a "yaw axis" is an axis that is directed towards the bottom of the aircraft, perpendicular to the wings. For example, and without limitation, a positive yawing motion may include adjusting and/or shifting the nose of aircraft 500 to the right. Principal axis may include a pitch axis. As used in this disclosure a "pitch axis" is an axis that is directed towards the right laterally extending wing of the aircraft. For example, and without limitation, a positive pitching motion may include adjusting and/or shifting the nose of aircraft 500 upwards. Principal axis may include a roll axis. As used in this disclosure a "roll axis" is an axis that is directed longitudinally towards the nose of the aircraft, parallel to the fuselage. For example, and without limitation, a positive rolling motion may include lifting the left and lowering the right wing concurrently.

Still referring to FIG. 5, pilot control 512 may be configured to modify a variable pitch angle. For example, and without limitation, pilot control 512 may adjust one or more angles of attack of a propeller. As used in this disclosure an "angle of attack" is an angle between the chord of the propeller and the relative wind. For example, and without limitation angle of attack may include a propeller blade angled 3.2°. In an embodiment, pilot control 512 may modify the variable pitch angle from a first angle of 2.71° to a second angle of 3.82°. Additionally or alternatively, pilot control 512 may be configured to translate a pilot desired torque for flight component 508. For example, and without limitation, pilot control 512 may translate that a pilot's desired torque for a propeller be 160 lb. ft. of torque. As a further non-limiting example, pilot control 512 may introduce a pilot's desired torque for a propulsor to be 290 lb. ft. of torque. Additional disclosure related to pilot control 512 may be found in U.S. patent application Ser. Nos. 17/001,845 and 16/929,206 both of which are entitled "A HOVER AND THRUST CONTROL ASSEMBLY FOR DUAL-MODE AIRCRAFT" by C. Spiegel et al., which are incorporated in their entirety herein by reference.

Still referring to FIG. 5, aircraft 500 may include a loading system. A loading system may include a system configured to load an aircraft of either cargo or personnel. For instance, some exemplary loading systems may include a swing nose, which is configured to swing the nose of aircraft 500 of the way thereby allowing direct access to a cargo bay located behind the nose. A notable exemplary swing nose aircraft is Boeing 747. Additional disclosure related to loading systems can be found in U.S. patent application Ser. No. 17/137,594 entitled "SYSTEM AND METHOD FOR LOADING AND SECURING PAYLOAD IN AN AIRCRAFT" by R. Griffin et al., entirety of which in incorporated herein by reference.

Still referring to FIG. 5, aircraft 500 may include a sensor 516. Sensor 516 may include any sensor or noise monitoring circuit described in this disclosure, for instance in reference to FIGS. 1-12. Sensor 516 may be configured to sense a characteristic of pilot control 512. Sensor may be a device, module, and/or subsystem, utilizing any hardware, software, and/or any combination thereof to sense a characteristic and/or changes thereof, in an instant environment, for instance without limitation a pilot control 512, which the sensor is proximal to or otherwise in a sensed communication with, and transmit information associated with the characteristic, for instance without limitation digitized data. Sensor 516 may be mechanically and/or communicatively coupled to aircraft 500, including, for instance, to at least a pilot control 512. Sensor 516 may be configured to sense a characteristic associated with at least a pilot control 512. An environmental sensor may include without limitation one or more sensors used to detect ambient temperature, barometric pressure, and/or air velocity, one or more motion sensors which may include without limitation gyroscopes, accelerometers, inertial measurement unit (IMU), and/or magnetic sensors, one or more humidity sensors, one or more oxygen sensors, or the like. Additionally or alternatively, sensor 516 may include at least a geospatial sensor. Sensor 516 may be located inside an aircraft; and/or be included in and/or attached to at least a portion of the aircraft. Sensor may include one or more proximity sensors, displacement sensors, vibration sensors, and the like thereof. Sensor may be used to monitor the status of aircraft 500 for both critical and non-critical functions. Sensor may be incorporated into vehicle or aircraft or be remote.

Still referring to FIG. 5, in some embodiments, sensor 516 may be configured to sense a characteristic associated with any pilot control described in this disclosure. Non-limiting examples of a sensor 516 may include an inertial measurement unit (IMU), an accelerometer, a gyroscope, a proximity sensor, a pressure sensor, a light sensor, a pitot tube, an air speed sensor, a position sensor, a speed sensor, a switch, a thermometer, a strain gauge, an acoustic sensor, and an electrical sensor. In some cases, sensor 516 may sense a characteristic as an analog measurement, for instance, yielding a continuously variable electrical potential indicative of the sensed characteristic. In these cases, sensor 516 may additionally comprise an analog to digital converter (ADC) as well as any additionally circuitry, such as without limitation a Whetstone bridge, an amplifier, a filter, and the like. For instance, in some cases, sensor 516 may comprise a strain gage configured to determine loading of one or flight components, for instance landing gear. Strain gage may be included within a circuit comprising a Whetstone bridge, an amplified, and a bandpass filter to provide an analog strain measurement signal having a high signal to noise ratio, which characterizes strain on a landing gear member. An ADC may then digitize analog signal produces a digital signal that can then be transmitted other systems within aircraft 500, for instance without limitation a computing system, a pilot display, and a memory component. Alternatively or additionally, sensor 516 may sense a characteristic of a pilot control 512 digitally. For instance in some embodiments, sensor 516 may sense a characteristic through a digital means or digitize a sensed signal natively. In some cases, for example, sensor 516 may include a rotational encoder and be configured to sense a rotational position of a pilot control; in this case, the rotational encoder digitally may sense rotational "clicks" by any known method, such as without limitation magnetically, optically, and the like.

Still referring to FIG. 5, electric aircraft 500 may include at least a motor 1224, which may be mounted on a structural feature of the aircraft. Design of motor 1224 may enable it to be installed external to structural member (such as a boom, nacelle, or fuselage) for easy maintenance access and to minimize accessibility requirements for the structure; this may improve structural efficiency by requiring fewer large holes in the mounting area. In some embodiments, motor 1224 may include two main holes in top and bottom of mounting area to access bearing cartridge. Further, a structural feature may include a component of electric aircraft 500. For example, and without limitation structural feature may be any portion of a vehicle incorporating motor 1224, including any vehicle as described in this disclosure. As a further non-limiting example, a structural feature may include without limitation a wing, a spar, an outrigger, a fuselage, or any portion thereof; persons skilled in the art, upon reviewing the entirety of this disclosure, will be aware of many possible features that may function as at least a structural feature. At least a structural feature may be constructed of any suitable material or combination of materials, including without limitation metal such as aluminum, titanium, steel, or the like, polymer materials or composites, fiberglass, carbon fiber, wood, or any other suitable material. As a non-limiting example, at least a structural feature may be constructed from additively manufactured polymer material with a carbon fiber exterior; aluminum parts or other elements may be enclosed for structural strength, or for purposes of supporting, for instance, vibration, torque or shear stresses imposed by at least propulsor 508. Persons skilled in the art, upon reviewing the entirety of this disclosure, will be aware of various materials, combinations of materials, and/or constructions techniques.

Still referring to FIG. 5, electric aircraft 500 may include a vertical takeoff and landing aircraft (eVTOL). As used herein, a vertical take-off and landing (eVTOL) aircraft is one that can hover, take off, and land vertically. An eVTOL, as used herein, is an electrically powered aircraft typically using an energy source, of a plurality of energy sources to power the aircraft. In order to optimize the power and energy necessary to propel the aircraft. eVTOL may be capable of rotor-based cruising flight, rotor-based takeoff, rotor-based landing, fixed-wing cruising flight, airplane-style takeoff, airplane-style landing, and/or any combination thereof. Rotor-based flight, as described herein, is where the aircraft generated lift and propulsion by way of one or more powered rotors coupled with an engine, such as a "quad copter," multi-rotor helicopter, or other vehicle that maintains its lift primarily using downward thrusting propulsors. Fixed-wing flight, as described herein, is where the aircraft is capable of flight using wings and/or foils that generate life caused by the aircraft's forward airspeed and the shape of the wings and/or foils, such as airplane-style flight.

With continued reference to FIG. 5, a number of aerodynamic forces may act upon the electric aircraft 500 during flight. Forces acting on electric aircraft 500 during flight may include, without limitation, thrust, the forward force produced by the rotating element of the electric aircraft 500 and acts parallel to the longitudinal axis. Another force acting upon electric aircraft 500 may be, without limitation, drag, which may be defined as a rearward retarding force which is caused by disruption of airflow by any protruding surface of the electric aircraft 500 such as, without limitation, the wing, rotor, and fuselage. Drag may oppose thrust and acts rearward parallel to the relative wind. A further force acting upon electric aircraft 500 may include, without limitation, weight, which may include a combined load of the electric aircraft 500 itself, crew, baggage, and/or fuel. Weight may pull electric aircraft 500 downward due to the force of gravity. An additional force acting on electric aircraft 500 may include, without limitation, lift, which may act to oppose the downward force of weight and may be produced by the dynamic effect of air acting on the airfoil and/or downward thrust from the propulsor 508 of the electric aircraft. Lift generated by the airfoil may depend on speed of airflow, density of air, total area of an airfoil and/or segment thereof, and/or an angle of attack between air and the airfoil. For example, and without limitation, electric aircraft 500 are designed to be as lightweight as possible. Reducing the weight of the aircraft and designing to reduce the number of components is essential to optimize the weight. To save energy, it may be useful to reduce weight of components of electric aircraft 500, including without limitation propulsors and/or propulsion assemblies. In an embodiment, motor 1224 may eliminate need for many external structural features that otherwise might be needed to join one component to another component. Motor 1224 may also increase energy efficiency by enabling a lower physical propulsor profile, reducing drag and/or wind resistance. This may also increase durability by lessening the extent to which drag and/or wind resistance add to forces acting on electric aircraft 500 and/or propulsors.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random-access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 6:
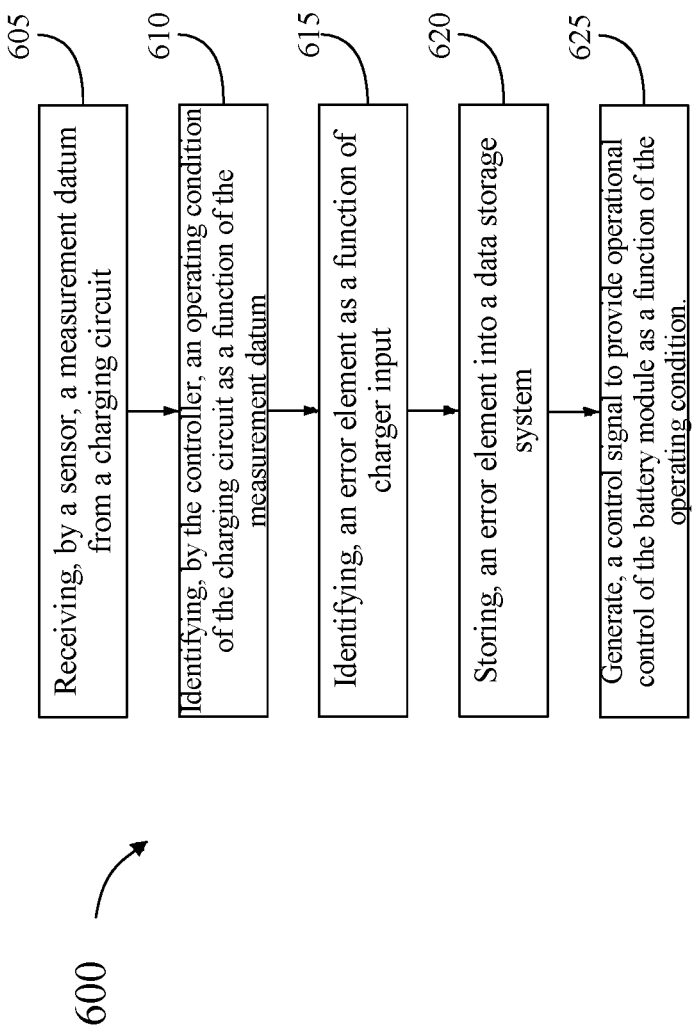
FIG. 6 is a flow diagram illustrating a method of use for a connector for charging an electric vehicle.

Referring now to FIG. 6, an exemplary method 600 of use for a connector for charging an electric vehicle. An electric vehicle may include any electric vehicle described in this disclosure, for example with reference to FIGS. 1-5. Connector may include any connector described in this disclosure, for example with reference to FIGS. 1-5. At step 605, method 600 may include receiving, by a sensor, a measurement datum from a charging circuit. A sensor may include any sensor described in this disclosure, for example with reference to FIGS. 1-5. A measurement datum may include any datum described in this disclosure, for example with reference to FIGS. 1-5.

With continued reference to FIG. 6, at step 610, method 600 may include identifying, by the controller, an operating condition of the charging circuit as a function of the measurement datum. A controller may include any controller described in this disclosure, for example with reference to FIGS. 1-5. The charging circuit may include any circuit that is described in this disclosure, for example with reference to FIGS. 1-5. Measurement datum may include any measurement datum described in this disclosure, for example with reference to FIGS. 1-5.

With continued reference to FIG. 6, at step 615, method 600 may include identifying, an error element as a function of charger input. An error element may include any error element described in this disclosure, for example with reference to FIGS. 1-5. An error element may include any error element described in this disclosure, for example with reference to FIGS. 1-5.

With continued reference to FIG. 6, at step 620, method 600 may include detect, using at least a sensor, and overvoltage within the system using an output voltage of the connector. A sensor may include any sensor described in this disclosure, for example with reference to FIGS. 1-5. A sensor may include any signal described in this disclosure, for example with reference to FIGS. 1-5.

With continued reference to FIG. 6, at step 625, method 600 may include storing, an error element into a data storage system. A data storage system may include any storage system described in this disclosure, for example with reference to FIGS. 1-5.

Figure 7:
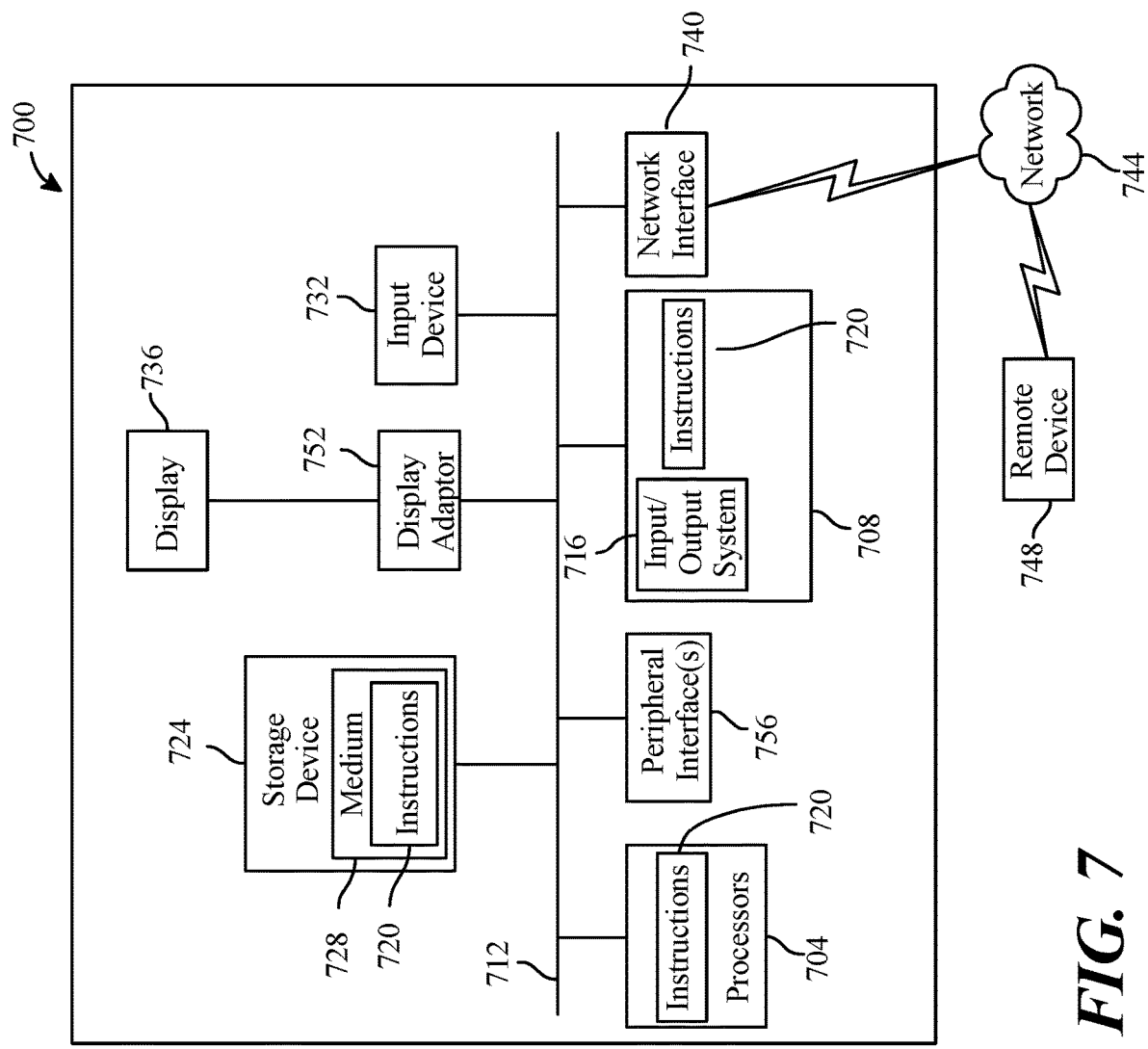
FIG. 7 is a block diagram of a computing system that can be used to implement any one or more of the methodologies disclosed herein and any one or more portions thereof.

FIG. 7 shows a diagrammatic representation of one embodiment of a computing device in the exemplary form of a computer system 700 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 700 includes a processor 704 and a memory 708 that communicate with each other, and with other components, via a bus 712. Bus 712 may include any of several types of bus structures including, but not limited to, a memory bus, a memory controller, a peripheral bus, a local bus, and any combinations thereof, using any of a variety of bus architectures.

Processor 704 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 704 may be organized according to Von Neumann and/or Harvard architecture as a non-limiting example. Processor 704 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating-point unit (FPU), and/or system on a chip (SoC).

Memory 708 may include various components (e.g., machine-readable media) including, but not limited to, a random-access memory component, a read only component, and any combinations thereof. In one example, a basic input/output system 716 (BIOS), including basic routines that help to transfer information between elements within computer system 700, such as during start-up, may be stored in memory 708. Memory 708 may also include (e.g., stored on one or more machine-readable media) instructions (e.g., software) 720 embodying any one or more of the aspects and/or methodologies of the present disclosure. In another example, memory 708 may further include any number of program modules including, but not limited to, an operating system, one or more application programs, other program modules, program data, and any combinations thereof.

Computer system 700 may also include a storage device 724. Examples of a storage device (e.g., storage device 724) include, but are not limited to, a hard disk drive, a magnetic disk drive, an optical disc drive in combination with an optical medium, a solid-state memory device, and any combinations thereof. Storage device 724 may be connected to bus 712 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 724 (or one or more components thereof) may be removably interfaced with computer system 700 (e.g., via an external port connector (not shown)). Particularly, storage device 724 and an associated machine-readable medium 728 may provide nonvolatile and/or volatile storage of machine-readable instructions, data structures, program modules, and/or other data for computer system 700. In one example, software 720 may reside, completely or partially, within machine-readable medium 728. In another example, software 720 may reside, completely or partially, within processor 704.

Computer system 700 may also include an input device 732. In one example, a user of computer system 700 may enter commands and/or other information into computer system 700 via input device 732. Examples of an input device 732 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 732 may be interfaced to bus 712 via any of a variety of interfaces (not shown) including, but not limited to, a serial interface, a parallel interface, a game port, a USB interface, a FIREWIRE interface, a direct interface to bus 712, and any combinations thereof. Input device 732 may include a touch screen interface that may be a part of or separate from display 736, discussed further below. Input device 732 may be utilized as a user selection device for selecting one or more graphical representations in a graphical interface as described above.

A user may also input commands and/or other information to computer system 700 via storage device 724 (e.g., a removable disk drive, a flash drive, etc.) and/or network interface device 740. A network interface device, such as network interface device 740, may be utilized for connecting computer system 700 to one or more of a variety of networks, such as network 744, and one or more remote devices 748 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 744, may employ a wired and/or a wireless mode of communication. In general, any network topology may be used. Information (e.g., data, software 720, etc.) may be communicated to and/or from computer system 700 via network interface device 740.

Computer system 700 may further include a video display adapter 752 for communicating a displayable image to a display device, such as display device 736. Examples of a display device include, but are not limited to, a liquid crystal display (LCD), a cathode ray tube (CRT), a plasma display, a light emitting diode (LED) display, and any combinations thereof. Display adapter 752 and display device 736 may be utilized in combination with processor 704 to provide graphical representations of aspects of the present disclosure. In addition to a display device, computer system 700 may include one or more other peripheral output devices including, but not limited to, an audio speaker, a printer, and any combinations thereof. Such peripheral output devices may be connected to bus 712 via a peripheral interface 756. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A connector for charging an electric aircraft, the connector comprising:
   at least one conductor configured to conduct a current within a charging circuit including at least one battery module, wherein the at least one conductor comprises:
      a direct current conductor configured to conduct a direct current; and
      an alternating current conductor configured to conduct an alternating current; and
   a controller, wherein the controller is configured to:
      receive a measurement datum of the at least one battery module from a communicatively connected sensor, wherein the measurement datum includes a measurement of moisture and a maintenance history of the charging circuit;
      determine an operating condition of the charging circuit;

identify an error element based on the operating condition, wherein the error element is identified by comparing a charger input to a preconfigured threshold, wherein the preconfigured threshold comprises at least a moisture threshold; and transmit the identification of the error element to a data storage system, wherein the data storage system is configured to store the error element and the maintenance history of the charging circuit remotely.

2. The connector of claim 1, wherein the measurement datum includes a current.

3. The connector of claim 1, wherein the measurement datum includes a temperature.

4. The connector of claim 1, wherein the measurement datum includes a voltage.

5. The connector of claim 1, wherein the measurement datum includes a resistance.

6. The connector of claim 1, wherein the communicatively connected sensor includes a plurality of sensors.

7. The connector of claim 1, wherein the error element is a data point denoting a degradation or failure of a component of an electric vehicle charger.

8. The connector of claim 1, wherein the controller is further configured to transmit an alert to a user interface as a function of the error element.

9. A method of use for a connector for charging an electric aircraft, the method comprising:

conducting, using at least one conductor configured to conduct a current within a charging circuit including at least one battery module, wherein the at least one conductor comprises:

a direct current conductor configured to conduct a direct current; and an alternating current conductor configured to conduct an alternating current;

receiving, measurement datum of the at least one battery module from a communicatively connected sensor, wherein the measurement datum includes a measurement of moisture and a maintenance history of the charging circuit;

determining, using a controller, an operating condition of the charging circuit;

identifying, an error element based on charger input, wherein the error element is identified by comparing a charger input to a preconfigured threshold, wherein the preconfigured threshold comprises at least a moisture threshold; and transmitting, the error element into a data storage system, wherein the data storage system is configured to store the error element and the maintenance history of the charging circuit remotely.

10. The method of claim 9, wherein the measurement datum includes a current.

11. The method of claim 9, wherein the measurement datum includes a temperature.

12. The method of claim 9, wherein the measurement datum includes a voltage.

13. The method of claim 9, wherein the measurement datum includes a resistance.

14. The method of claim 9, wherein the communicatively connected sensor includes a plurality of sensors.

15. The method of claim 9, wherein the error element is a data point denoting a degradation or failure of a component of an electric vehicle charger.

16. The method of claim 9, further comprising transmitting, by the controller, an alert to a user interface as a function of the error element.

* * * * *